United States Patent [19]

Nakata

[11] Patent Number: 5,071,789
[45] Date of Patent: Dec. 10, 1991

[54] METHOD FOR FORMING A METAL ELECTRICAL CONNECTOR TO A SURFACE OF A SEMICONDUCTOR DEVICE ADJACENT A SIDEWALL OF INSULATION MATERIAL WITH METAL CREEP-UP EXTENDING UP THAT SIDEWALL, AND RELATED DEVICE

[75] Inventor: Rempei Nakata, Tokyo, Japan
[73] Assignee: Kabushiki Kaisha Toshiba, Kanagawa, Japan
[21] Appl. No.: 536,933
[22] Filed: Jun. 12, 1990

Related U.S. Application Data

[63] Continuation of Ser. No. 425,455, Oct. 23, 1989, abandoned, which is a continuation of Ser. No. 178,255, Apr. 5, 1988, abandoned, which is a continuation of Ser. No. 890,920, Jul. 30, 1986, abandoned.

[30] Foreign Application Priority Data

Aug. 2, 1985 [JP] Japan .............................. 60-170764

[51] Int. Cl.$^5$ .......................................... H01L 21/283
[52] U.S. Cl. .................................... 437/192; 437/246; 437/201
[58] Field of Search ............... 437/192, 195, 200, 201, 437/24, 245, 246; 357/71, 67

[56] References Cited

U.S. PATENT DOCUMENTS

| 4,271,424 | 6/1981 | Inayoshi et al. | 357/67 |
| 4,616,401 | 10/1986 | Takeuchi | 437/192 |
| 4,670,967 | 6/1987 | Hazuki | 437/192 |

FOREIGN PATENT DOCUMENTS

| 0028360 | 2/1984 | Japan | 437/192 |
| 0061446 | 4/1984 | Japan | 437/192 |
| 0063745 | 4/1984 | Japan | 437/192 |
| 0084576 | 5/1984 | Japan | 437/192 |
| 0186038 | 9/1985 | Japan | 437/192 |
| 0229350 | 11/1985 | Japan | 437/192 |

OTHER PUBLICATIONS

Moriya, et al., IEEE IEDM Technical Digest, 1983, pp. 550-553.
Vossen, J. Vac. Sci. Technol., 19(3), Sep./Oct. 1981, pp. 761-765.
Moriya, et al., "A New Encroachment Free . . . ", Ext. Abs. 15th Conf. Solid State Dev. and Mat., Tokyo, 1983, pp. 225-228.
Panleau, Y., "Chemical Vapour . . . ", Thin Solid Films, 122 (1984), pp. 243-258.
Itoh, et al., "Creep-up Phenomena . . . ", IEEE IEDM Technical Digest, Dec. 1985, pp. 606-609.

Primary Examiner—Brian E. Hearn
Assistant Examiner—T. N. Quach
Attorney, Agent, or Firm—Finnegan, Henderson, Farabow, Garrett, and Dunner

[57] ABSTRACT

Contact with a substrate or conductor underlying an opening in the insulating layer is made by depositing a thin film of high melting point metal using a selective vapor phase growth process so that the metal film grows across the exposed surface and then creeps-up the sidewalls of the insulating layer. Electrical contact is completed by covering the thin film with a thicker growth of high melting point metal, preferably using a second selective vapor phase growth process, and then depositing a conducting film over the insulating layer in electrical contact with the thicker growth of metal.

14 Claims, 10 Drawing Sheets

METHOD FOR FORMING A METAL ELECTRICAL CONNECTOR TO A SURFACE OF A SEMICONDUCTOR DEVICE ADJACENT A SIDEWALL OF INSULATION MATERIAL WITH METAL CREEP-UP EXTENDING UP THAT SIDEWALL, AND RELATED DEVICE

This application is a continuation of application Ser. No. 07/425,455, filed Oct. 23, 1989, now abandoned, which is a continuation of application Ser. No. 07/178,255, filed Apr. 5, 1988, now abandoned, which is a continuation of application Ser. No. 06/890,920, filed July 30, 1986, now abandoned.

BACKGROUND OF THE INVENTION

1. Field of the Invention

The present invention relates to electrical connections for a semiconductor device made from high melting point metal and to related methods of making these connections to assure good electrical contact between interconnected semiconductor device elements.

2. Background Information

Figure 1:
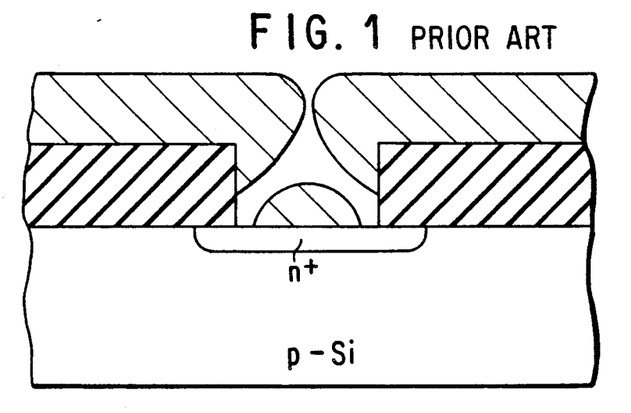
FIG. 1 shows a cross sectional diagram illustrating the drawbacks of the prior art.

As the degree of integration of MOS integrated circuit elements increases, the area available for making electrical connections between metallic conductors and semiconductor surface regions, such as polycrystalline-silicon gate electrodes or source-drain diffused layers, is becoming extremely small. Moreover, the depth of pn junctions in surface diffused layers is becoming extremely shallow. The sputtering method, which ordinarily is used for making electrical connections to such regions, tends to produce deteriorated connections as the size of contact holes through overlying insulating layers becomes increasingly small. Frequently, metallic conductors fail to contact the surface region region at the bottom of the contact hole because of a "shadowing" effect, shown in FIG. 1, where metal deposition at the top of the sidewalls of the contact hole prevents sufficient deposition of metal at the bottom of the hole to achieve a good electrical connection with the underlying surface region. In giant LSI circuits having more than one million elements on a several millimeter square chip, such a deterioration in the electrical connections results in a substantial reduction in the reliability of the resultant device.

Figure 2:
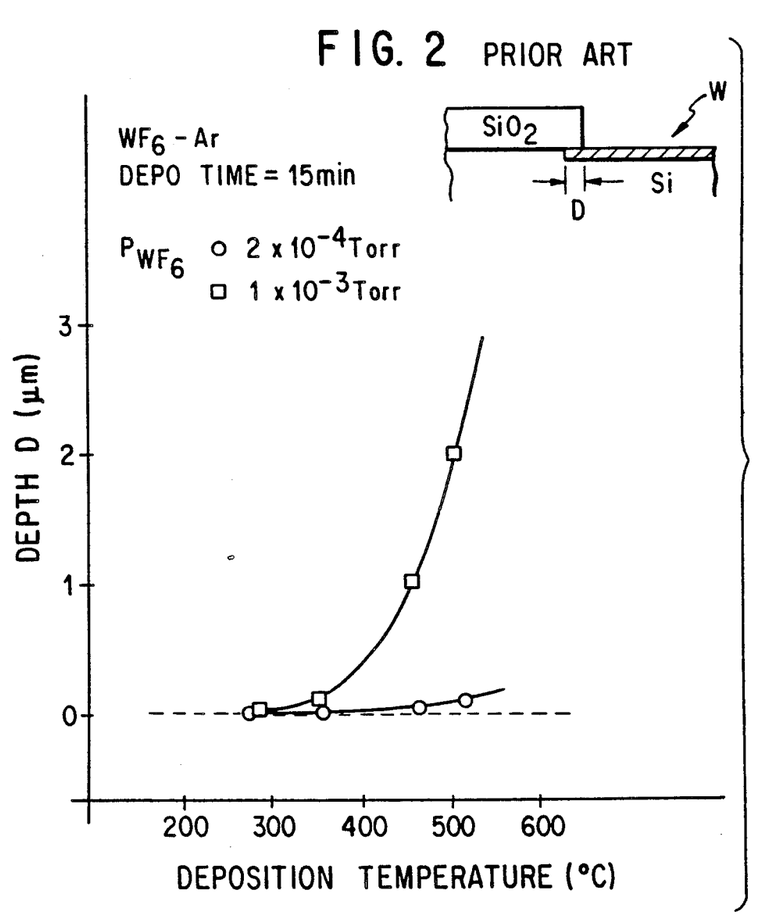
FIG. 2 shows a prior art characteristic curve of the relationship of encroachment depth with temperature.

Growth of thin films of tungsten at the bottom of the contact hole to facilitate connection with overlying conductors may result in tungsten encroachment along the edges of the interface of the insulation layer in which the contact hole is made and the surface region to which electrical contact is to be made, resulting in degradation of device performance. This encroachment was thought to increase with temperature and partial pressure as shown in FIG. 2.

In current day 64K bit 256K bit dynamic random access MOS-type memories, the for mask matching is on the order of 0.2 μm, or less than . of the minimum size of 2 to 3 μm for a memory element. minimum size becomes 1 μm or enters the submicron region matching precisions of less than 0.1 μm will be necessary. However, since the matching precision is largely dictated b mechanical precision of the semiconductor device, a precision of 0.1 μm will be difficult to achieve and will result in the following problems. First, contact hole mismatches will . in a decrease of the contact area between aluminum i ion material and the underlying surface regions to which elect contact is to be made, causing increased electrical resistance. Second, overetching during preparation of the hole will cause defects such as punctures in the interconnect areas because of the decrease in the area of the insulation film in the region surrounding the underlying source and drain regions, and will result in defective connections.

Accordingly, there exists a need for a technique to produce highly reliable electrical connections that do not significantly deteriorate the performance of semiconductor devices.

SUMMARY OF THE INVENTION

It is, accordingly, an object of the present invention to provide high reliability electrical connections and methods of forming same.

Additional objects and advantages of the invention will be set forth in the description which follows, and in part will be obvious from the description, or may be learned by practice of the invention.

To achieve the foregoing objects, and in accordance with the purposes of the invention as embodied and broadly described herein, a method of forming an electrical connection to a surface of a semiconductor device adjacent a sidewall of insulating material, is provided, comprising the steps of: (a) exposing the surface to a halogenized gas of a high melting point metal under conditions to reduce the gas with the surface to result in formation of a layer of the metal on the surface, the conditions including deposition of the layer at a sufficiently high temperature to essentially minimize the resultant thickness of the layer, whereby the layer is also formed extending up the sidewall; and (b) forming a conductor in electrical contact with the layer to thereby form electrical connection with the surface.

Additionally, an electrical connection to a surface of a semiconductor device adjacent a sidewall of insulating material, is provided, comprising: (a) a thin film of a high melting point metal formed on the surface by vapor deposition and formed on a portion of the sidewall by creeping of the metal up onto the portion of the sidewall from the portion of the metal formed on the surface; and (b) a conductor formed in electrical contact with the thin film thereby forming electrical connection with the surface.

DESCRIPTION OF THE PREFERRED EMBODIMENTS

Figure 3A:
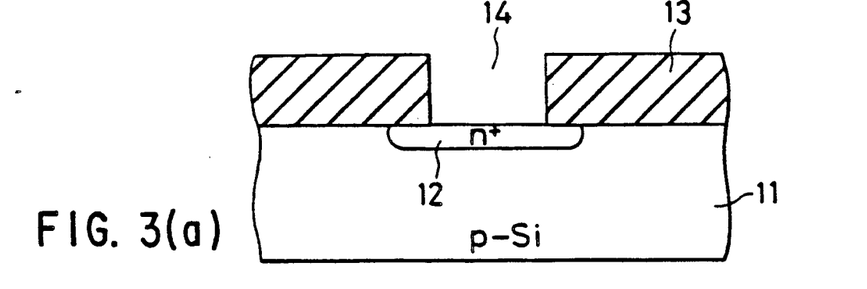
FIGS. 3(a) through 3(c) show cross sectional diagrams for illustrating the process for a first embodiment of the present invention.
Figure 3B:
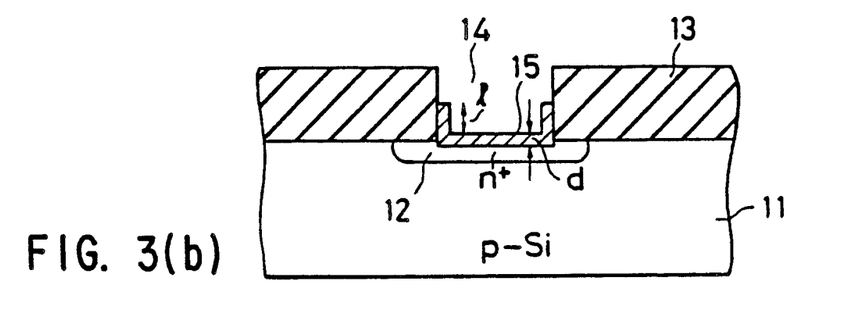
Figure 3C:
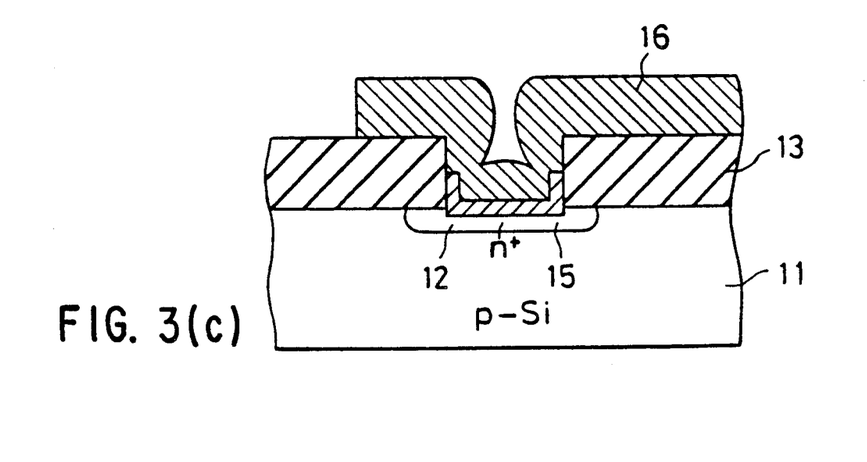

FIGS. 3(a) through 3(c) are the manufacturing process diagrams for a first embodiment of the present invention. As shown in FIG. 3(a), an n+type diffused layer 12 with a junction depth of 0.15 μm is formed by ion implantation in a p-type Si substrate 11, then a silicon oxide film 13 with a thickness of 1 μm is deposited as an insulation film over the surface of the substrate by the Chemical Vapor Deposition (CVD) method, and a contact hole 14 for the diffused layer 12 is formed using the PEP process by selectively etching the oxide film 13. Then as shown in FIG. 3(b), a tungsten (W) layer 15 of thickness 200 angstroms is formed on the n+-type diffused layer 12 that is exposed to the contact hole 14, by means of the selective vapor phase growth method that employs tungsten hexafluoride ($WF_6$) and argon (Ar). The conditions for the selective growth in this case consist of a substrate temperature of 550 degrees Celsius, a pressure in the reaction furnace of 0.2 Torr, and a $WF_6$ partial pressure of 0.01 Torr. With these conditions, as the W film 15 grows, film 15 creeps up the sidewalls from the bottom of contact hole 14. After that, as shown in FIG. 3(c), an (Al) film is vacuum evaporated as an interconnection layer, interconnection 16 is formed by patterning the Al film. Finally, a heat treatment is given in a forming gas at 450 degrees Celsius for 15 minutes.

According to this embodiment, it is possible to obtain satisfactory electrical connection with a surface region exemplified by diffusion layer 12, since the W film 15 serves as a protection against contact failure of the Al film, yet to damage occurs to the junction of diffused layer 12 and substrate 11 as a result of encroachment of W at the bottom portion of the contact hole along the interface between oxide film 13 and substrate 11. As will be explained in more detail below, the lack of encroachment and the presence of "creep-up" the sidewall of contact hole 14 is a result of the conditions under which the W film 15 was formed.

Figure 4:
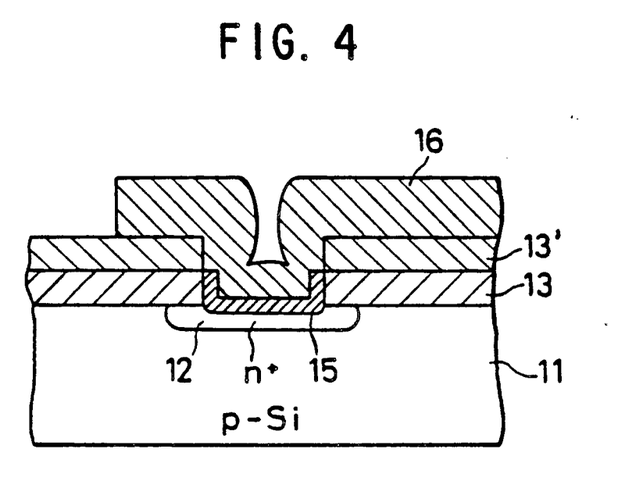
FIG. 4 is a cross sectional diagram illustrating a modification to the device shown in FIGS. 3(a) through 3(c).

FIG. 4 is a cross section diagram showing a modification to the embodiment just described. Here, the insulation film consists of a lamination of an $SiO_2$ film 13 obtained by CVD and a PSG film 13'. Since the W film 15 does not creep-up onto the surface of the PSG film 13', the amount of creeping up can be controlled in this embodiment.

In the embodiments shown in FIGS. 3 and 4, to prevent the Al film 16 from failing to make adequate contact, the extent of creeping up of the W film preferably is set to be more than ½ of the depth of the opening in the insulation film.

Figure 5A:
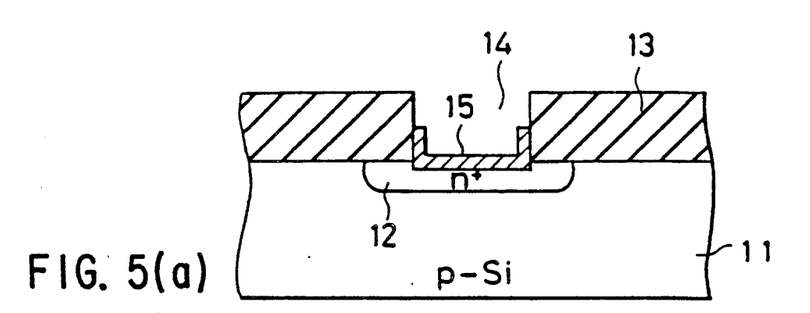
FIGS. 5(a) through 5(c) show cross sectional diagrams illustrating the process for a second embodiment of the present invention.
Figure 5B:
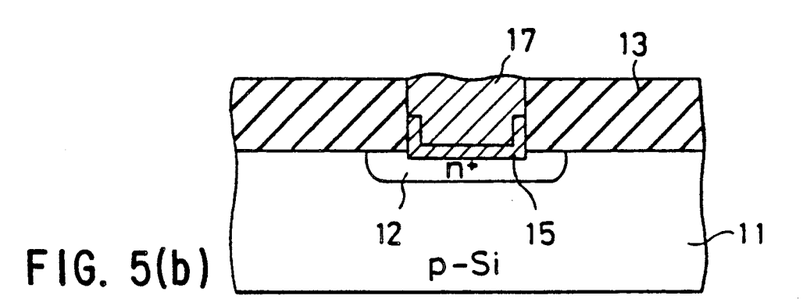
Figure 5C:
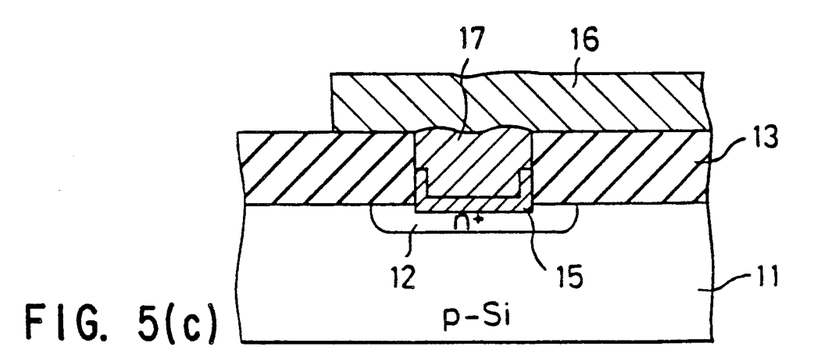

FIGS. 5(a) to 5(c) are manufacturing process diagrams for a second embodiment of the present invention As shown in FIG. 5(a), an n+-type diffusion layer 12 is formed on a p-type Si substrate 11, and oxide film 13 is deposited to a thickness of 1 on top of the layer 12 by the CVD method. A contact hole 14 for the oxide film 13 is formed. Up to this point, the process is similar to the first embodiment, shown in FIG. 3. A first W film 15 of thickness 200 angstroms is formed using $WF_6$ and Ar gases and formation conditions similar to the previous embodiment, so as not to create an encroachment of the W along the insulator to substrate interface. Next, a thick W film 17 is buried on the inside of the contact hole 14 as shown in FIG. 5(b) by a second growth process using $WF_6$ and $H_2$ gases. The growth conditions for thick W film 17 require a substrate temperature of 300 to 600 degrees Celsius, a pressure in the reaction furnace of 0.01 to 5 Torr, and a molar ratio of $H_2/WF_6$ of 20. If the first growth process were omitted prior to the second growth process, the second W film may encroach along the insulator to substrate interface. Because a thin W film 15 is buried beforehand by the first growth process, (using conditions in which there will be no encroachment) the second film causes no device deterioration Additionally, the first W film on the sidewalls of the contact hole causes the second W film to grow from the sidewall area. Therefore, the time for growing the second W film is short, and sufficient selectivity for deposition of the film over the flat surface of the oxide film 13 can be retained. In cases where selectivity cannot be maintained, a W film might also form on the flat oxide film, causing device failures. In the next step, an Al interconnection 16 is formed as shown in FIG. 5(c), similar to the first embodiment.

In this second embodiment, electrical contacts can be made through extremely fine contact holes to underlying surface regions without accompanying breakdown of the surface regions to substrate junctions and, because the contact hole is buried with a thick W film in a two step growth process contact failures can be prevented resulting in improved reliability contacts.

The following discussion presents the reasons why a W film grown according to the methods taught by this invention does not grown according to the methods taught by this invention does not encroach along the interface between the insulation film and the substrate, according to theories based on currently available experimental data.

Figure 6:
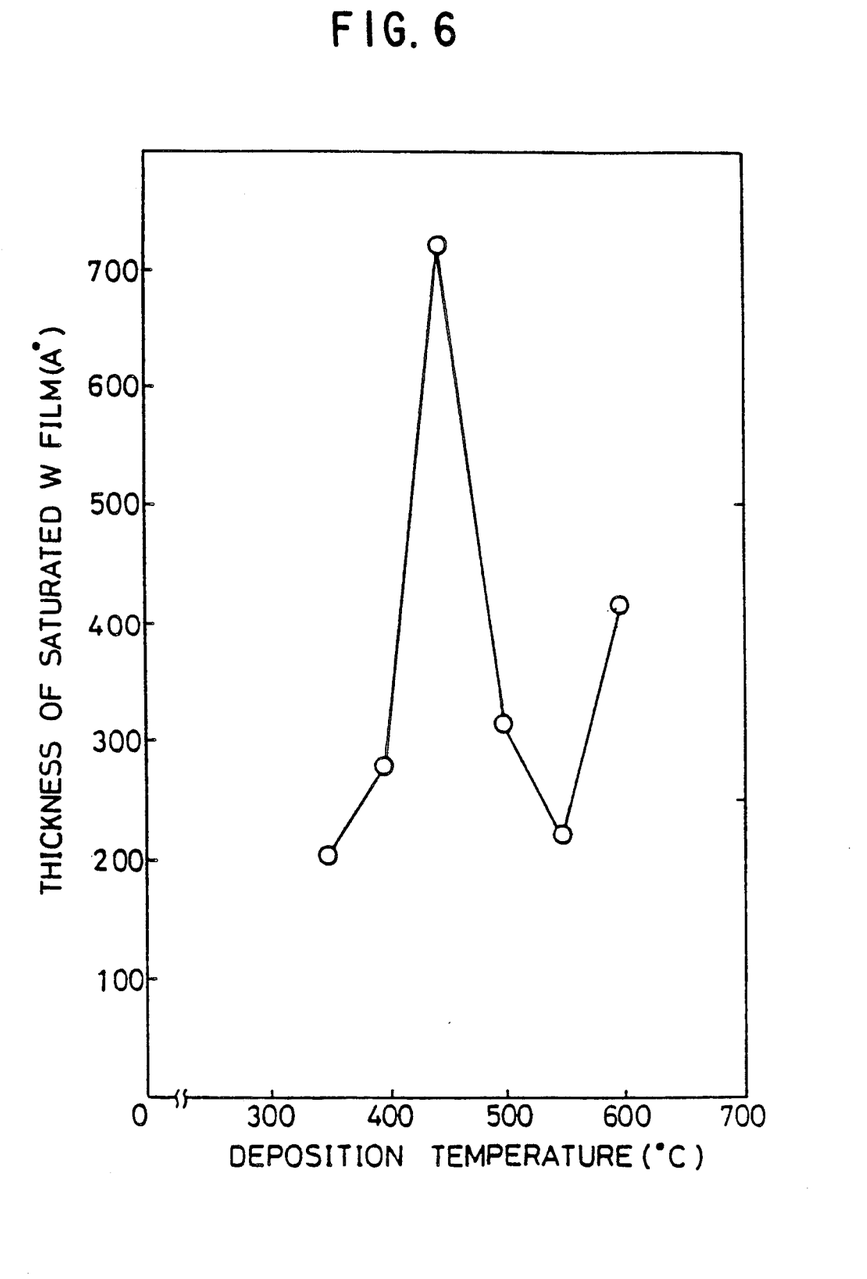
FIG. 6 is a characteristic curve showing the discovered relationship between the deposition temperature and the saturated film thickness for tungsten.
Figure 7:
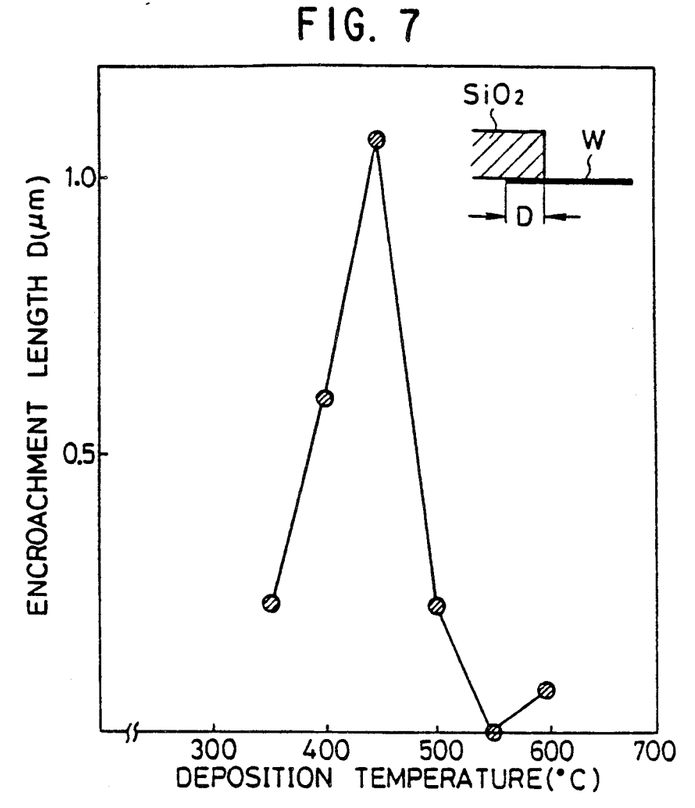
FIG. 7 is a characteristic curve showing the discovered relationship between the deposition temperature and the encroachment length for tungsten.

In the silicon reduction reaction of $WF_6$, the thickness of the W film reaches a saturated value (saturated film thickness) which is a function of the deposition conditions. This saturated film thickness corresponds to the amount of W reduced with Si. The temperature dependence of the saturated W film thickness is shown in FIG. 6. In this case, the growth conditions for the W film were set at a pressure in the reaction furnace of 0.2 Torr and a $WF_6$ partial pressure of 0.01 Torr. FIG. 7 shows the discovered temperature dependence of the encroachment length D of the W film from the edge of the $Si/SiO_2$ interface. W film encroachment results in damage to the junction. According to experimental results, the saturated thickness of the W film shows a maximum at 450 degrees Celsius and a minimum at 550 Celsius. The encroachment length D of the W film shows a at 450 degrees Celsius and decreases with increasing until, in the neighborhood of 550 degrees Celsius, growth of the W film occurs without creating encroachment. Instead, at about 550 degrees Celsius, the W film creeps-up on the sidewalls of the contact hole.

Although the mechanism for a decrease in the encroachment with an increase in temperature beyond 450 degrees Celsius is not clear yet, this discovery may be explained as follows. The Si reduction reaction of $WF_6$ may be represented by the following equation:

The SiF$_4$ generated by this reaction attaches to the sidewalls of the contact hole, and the W film grows with the attached SiF$_4$ as the base. Consequently, the creep-up of the film is closely related to the amount of SiF$_4$ generated and the concentration of WF$_6$. The particularly conspicuous creep-up of the W film resulting from the reduction reaction of WF$_6$ by the base Si occurs in the neighborhood of 550 degrees Celsius, where a minimum in the saturation of the deposited film thickness takes place.

At 550 degrees Celsius, the amount of creep-up of W film shown in FIG. 3 and FIG. 9 (to be described water), far exceeded ten times the saturated film thickness D. Even at 550 ±30 degrees Celsius, the value of L/D was greater than 3. Thus it is important to grow the W film at its minimum thickness in order to bring about a conspicuous creep-up, suppress encroachment, and obtain a high reliability contact.

Although the W film was grown at 550 degrees Celsius under the above conditions, growth conditions may be selected from the substrate temperature range of 500 to 600 degrees Celsius, a pressure in the reaction furnace of more than 0.01 Torr (for example, 0.01 to 1 Torr), and a partial pressure of the halogenized high melting point metal of more than 0.001 Torr (for example, 0.001 to 0.5 Torr). WF$_6$ gas and Ar gasses were used in the above embodiments, but Ar may be replaced by other e gasses such as He, N$_2$ or H$_2$ may be used. A separate use of WF$_6$ may also be made, in which case the pressure in the reaction furnace should be over 0.001 Torr (for example, 0.001 to 0.5 Torr).

Figure 8:
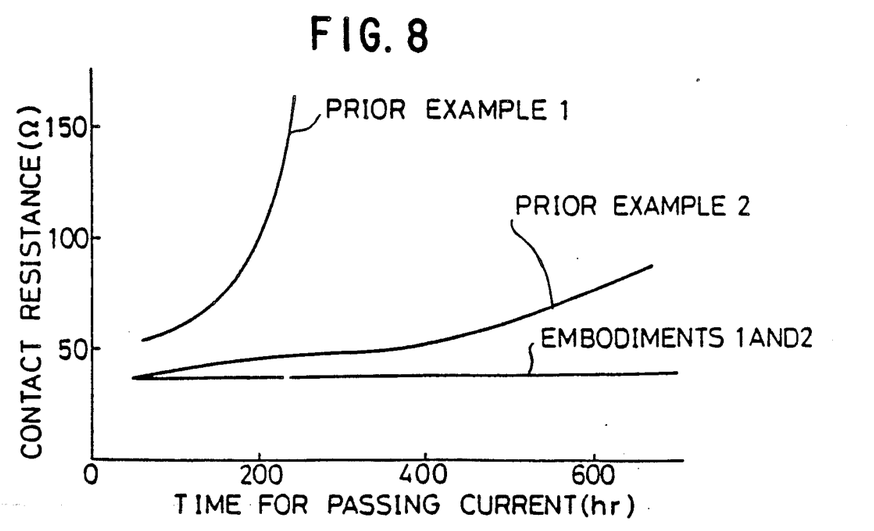
FIG. 8 shows characteristic curves of the contact resistance obtainable by the embodiments of the present invention.

FIG. 8 shows the results of stress tests (connection tests) on the contact resistance of the Al connection with the underlying diffused layer for the embodiments of the present invention The curve designated as EMBODIMENTS 1 AND 2 corresponds to the embodiments shown in FIGS. 3, 4, and 5 The curve marked as PRIOR EXAMPLE 1 corresponds to the case of direct contact with the Al interconnection (Al+1% Si) without growing a W film for the n+-type diffused layer. The curve marker as PRIOR EXAMPLE 2 is for a process which is basically similar to the embodiment shown in FIG. 3. However, the substrate temperature for the selective growth of the W film was set at a low temperature of 350 degrees Celsius and a W film with a thickness 200 angstroms was grown Only in the bottom section of the contact hole. As may be clear from these experimental findings, the interconnection according to the present invention shows no increase in the contact resistance, even for a stress test of 600 hours, and shows a marked improvement in reliability.

The present invention is by no means limited to the above embodiment. Thus, for example, in the embodiments described, reference was made where an interconnection is made to a surface of a semiconductor device in the form of a diffused layer in the surface of a Si substrate. However, the method and resultant apparatus of the present invention may also be applied where an interconnection is made via a contact hole to a surface of a semiconductor device in the form of an electrode of polycrystalline Si film formed on an oxide film with doping of lead, boron, or arsenic. The problem of contact failure still exists in such a case because of a volume contraction in the encroachment section that creates gaps in the insulation film, lowering the reliability of the contact.

The embodiments shown in FIGS. 3 and 4 have only one process of W film growth, while the embodiment shown in FIG. 5 has two stages of growth. The present invention is effective so long as the growth conditions are set to have the film creep-up the sidewalls of the contact hole. Also, the second embodiment used selective growth of a second W film. The present invention can still further be applied to the growth of films of other high melting point metals such as molybdenum (Mo) tantalum (Ta), and titanium (Ti) by means of similar vapor phase growth methods using MoF$_6$, TaF$_6$, TiF$_6$ and so on.

FIGS. 9(a) through 9(f) illustrate the manufacturing process of a MOSFET device according to a third embodiment of the present invention.

Figure 9A:
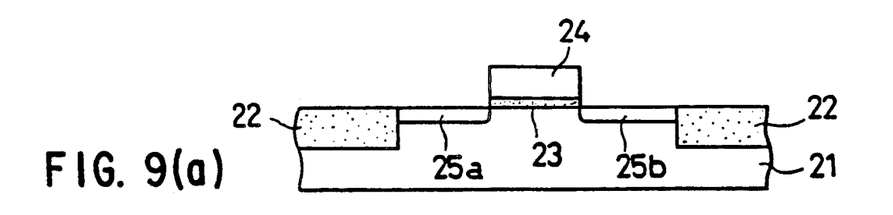
FIGS. 9(a) through (g) show cross sectional diagrams and a top view illustrating the process for a third embodiment of the present invention.

First, a field oxide film (insulation film) 22 for separation of elements is formed on a p-type silicon substrate 21 to obtain an element formation region. Then, on a thin gate oxide film 23 formed in the element formation region, there is formed a gate electrode 24 that consists of a polycrystalline silicon layer heavily doped with phosphorus. Subsequently, shallow n$^{-1}$ diffused layers 25a and 25b are formed to establish source and drain regions by implanting phosphorus ions (P+) by means of the ion implantation method with an accelerating voltage of 40 KeV and an implantation amount of $1 \times 10^{14}/cm^2$, using the gate electrode 24 and the field oxide film 22 as a mask as shown in FIG. 9(a).

Figure 9B:
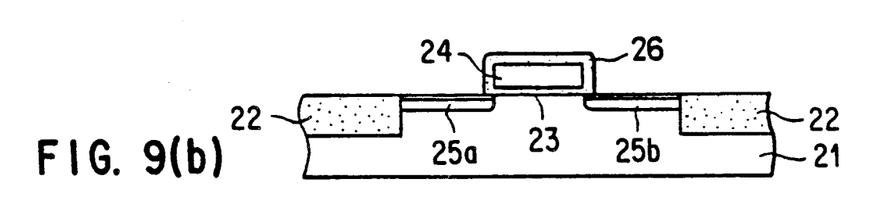

Next as shown in FIG. 9(b), oxidation of hydrogen by combustion is carried out by heating the system to a temperature of 750 degrees Celsius to form an oxide film (insulation film) 26 over the surface of the shallow diffused layer for the gate electrode 24 and the source and drain regions. In so doing, it is possible to enhance the dependence of the oxidation speed on the impurity concentration by carrying out the hydrogen oxidation by combustion at a low temperature of 750 degrees Celsius to form a thicker oxide film over the gate electrode than over the source and drain regions. The thickness of the oxide film was 600 angstroms over the gate electrode while it was 100 angstroms over the source and drain regions.

Figure 9C:
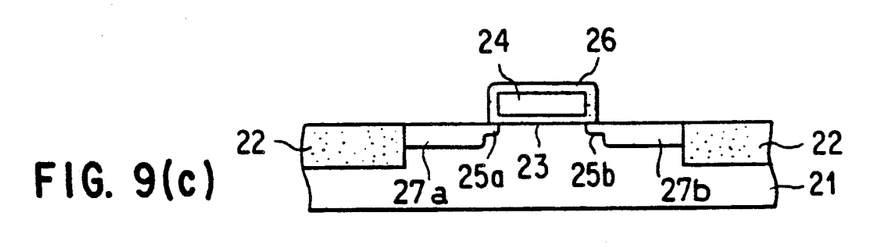

Subsequently, as shown in FIG. 9(c), the oxide film 26 is etched until the source and drain regions are exposed by reactive ion etching which makes use of a freon series gas or by wet etching which makes use of a diluted solution of fluoric acid. Following that, deep n+diffused layers 27a and 27b are formed in the source and drain regions by implanting arsenic ions by the ion implantation method with an accelerating voltage of 50 KeV and an implantation amount of $1 \times 10^{16}/cm^2$.

Figure 9D:
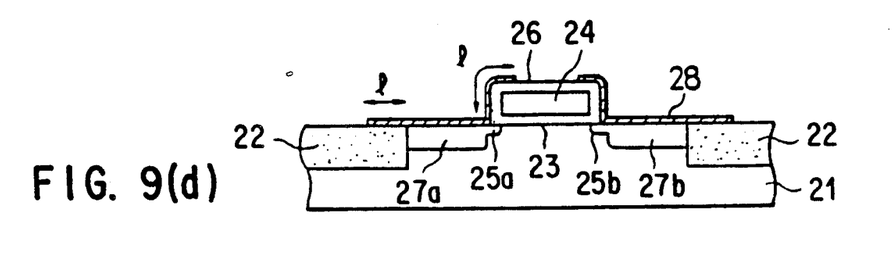

Next, as shown in FIG. 9(d), W films 28 are grown selectively the deep n+diffused layers 27a and 27b and over the neighboring insulation films 22 and 26 so as to creep-up these films by the CVD method at low pressure.

Here, the low pressure CVD process for the W film formation consists of two processes. The first process is for formation of a thin W film with thickness of about 200 angstroms over the n+diffused layers 27a and 27b and over the surrounding insulation films 22 and 26 by using WF$_6$ and Ar gasses with the following conditions: a substrate temperature of 550 degrees Celsius, a vacuum of 0.2 Torr, WF$_6$ partial pressure of 0.01 Torr, and a deposition time of 3 minutes. The second process is one for increasing the thickness of the thin W film obtained by the first process to a predetermined thickness, using WF$_6$ and H$_2$ as the reaction gases (keeping the molar ratio of $H_2/WF_6$ to 20 ) under the conditions of a substrate temperature of 300 to 600 degrees Celsius and a pressure in the reaction furnace of 0.01 to 5 Torr. As a result, the W film 28 extends over the insulation films 22 and 26 that are situated in the neighborhood of the $n^+$ diffused layers 27a and 27b.

Figure 9E:
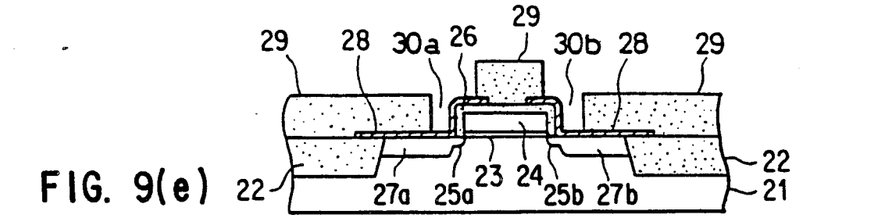
Figure 9F:
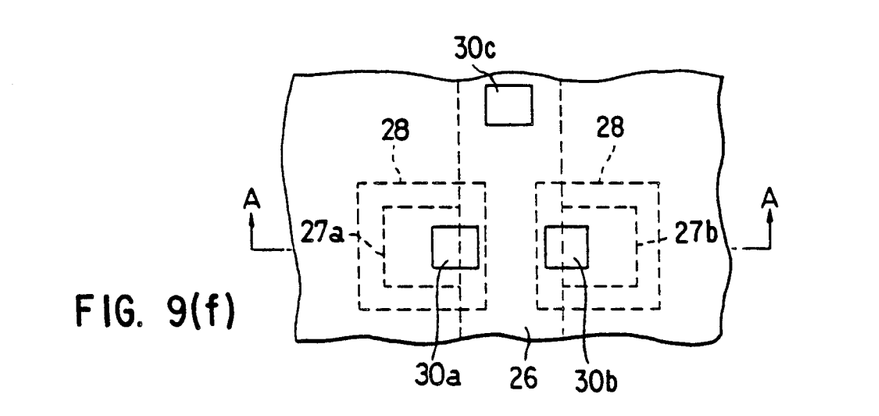

Further, as shown in FIGS. 9(e) and 9(f), an insulation film 29 consisting of silicon oxide ($SiO_2$) is deposited by the plasma CVD method using silane ($SiH_4$) and nitrogen oxide ($N_2O$) gasses. Then, contact holes 30a, 30b, and 30c are created by the reactive ion etching method that makes use of a freon series gas, with a resist pattern (not shown) that is formed by the photoetching method as a mask. Now, the oxide film formed is thicker on the gate electrode than on the source and drain regions ($n^+$ diffused layers 27a and 27b). In contrast to the overetching of the source and drain regions that occurs in the ordinary process, in the present process where a W film acts as an etching stopper, no etching will take place for the $n^+$ diffused layers 27a and 27b and for the insulation film 26 on the sidewalls of the gate electrode. FIG. 9(e) corresponds to the A-A cross section of FIG. 9(f).

Figure 9G:
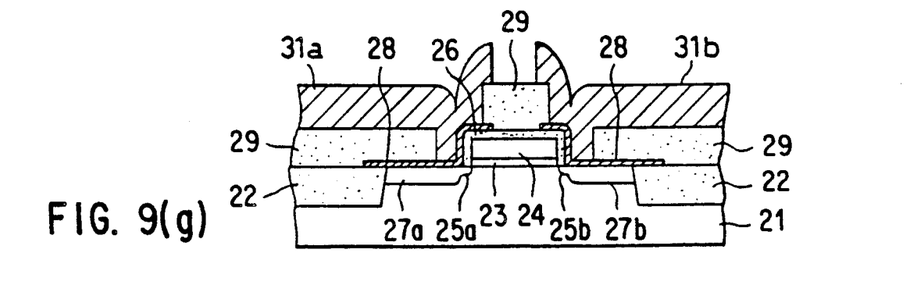

Next, an Al film with a thickness of 0.8 $\mu$m is deposited on top of the surface as shown in FIG. 9(g) by the sputtering method. The interconnections 31a and 31b for the source and drain regions and an interconnection for the gate (not shown) are formed by patterning the Al film.

A MOSFET formed in this manner has high reliability contacts with low electrical resistance, since a W film is interposed extending from the shallow diffused source and drain regions to the surface of the gate. Further, the W film can prevent overetching in the formation of contact holes in the field oxide film, generated as a result of overetching and mismatching in the source and drain regions, even when the overetching and mismatching cover a part of the field. Therefore, even with extreme miniaturization of the elements, junction breakdowns can be avoided, resulting in highly reliable electrical contacts.

Figure 10A:
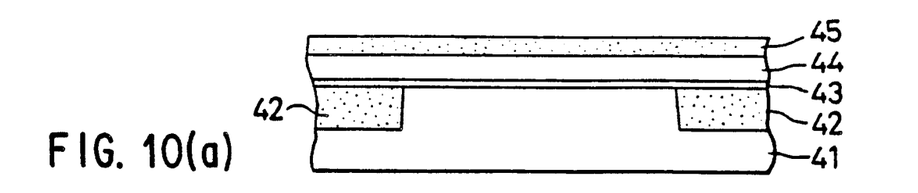
FIGS. 10(a) through (g) show cross sectional diagrams illustrating the process for a fourth embodiment of the present invention.
Figure 10B:
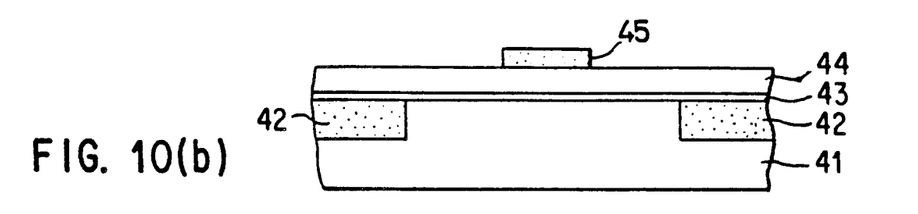

The manufacturing process of MOSFET devices according to a fourth embodiment of the present invention will now be described. First, as shown in FIG. 10(a), an element formation region is obtained by forming a field oxide film 42 for element separation on a p-type silicon substrate. Then, a gate oxide film 43, polycrystalline silicon film 44 which is heavily doped with phosphorus, and insulation film 45 consisting of a silicon oxide film formed by the CVD method, are formed in succession over the field oxide film 42. Next, the silicon oxide film 45 is patterned as shown in FIG. 10(b) by means of the photolithography method. Then, a gate electrode 44 is formed by selectively removing the gate oxide film 43 and the polycrystalline silicon film 44 by reactive ion etching which makes use of a freon series gas, with the silicon oxide film 45 as the mask.

Figure 10C:
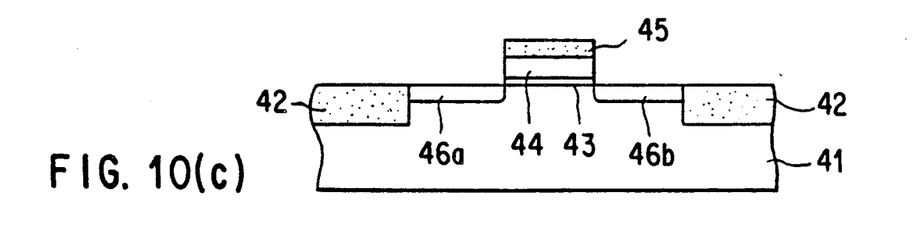
Figure 10D:
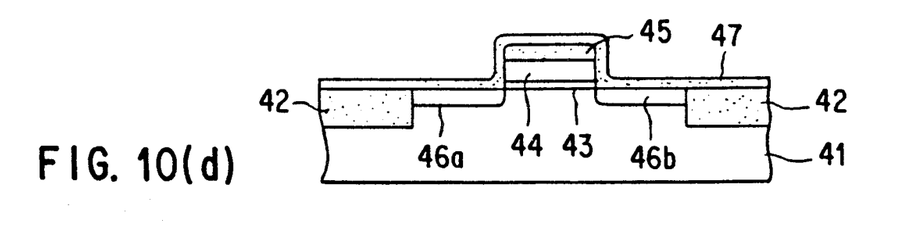

After that, shallow $n^-$ diffused layers 46a and 46b are formed in the source and drain regions by implanting phosphorus ions by means of the ion implantation method, using an accelerating voltage of 40 KeV and an implantation amount of $1 \times 10^4/cm^2$ as shown in FIG. 10(c). Further, as shown in FIG. 10(d), an insulation film 47 consisting of a silicon oxide film with thickness of 0.3 $\mu$m is deposited over the surface of the substrate by the CVD method. Then, the surface is etched by means of the reactive ion etching method by making use of a freon series gas, leaving the insulation films 45 and 47 to cover the gate electrode. In the reactive ion etching method, etching proceeds in the vertical direction alone so that the insulation film 47 remains on the sidewalls of the gate electrode 44. On the other hand, the insulation film 47 is laminated over the insulation film 45 that was formed in the preceding process so that the insulation film 45 remains after the insulation film 47 on the source and drain regions is removed.

Figure 10E:
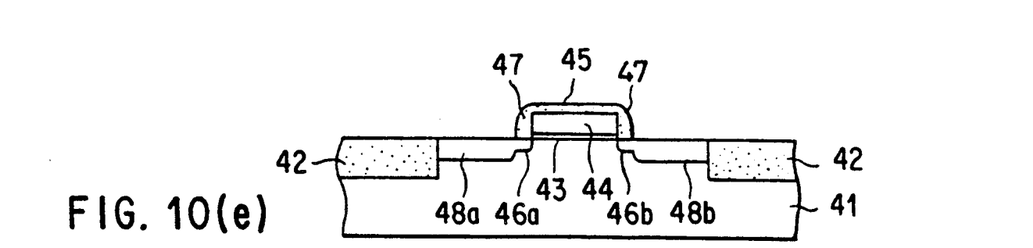

In this way, $n^+$ diffused layers 48a and 48b are formed deep in the source and drain regions by implanting arsenic ions ($As^{30}$) *by the ion implanting method as shown in FIG. 10(e)* with an accelerating voltage of 50 KeV and an implantation amount of $1 \times 10^{16}/cm^2$.

Figure 10F:
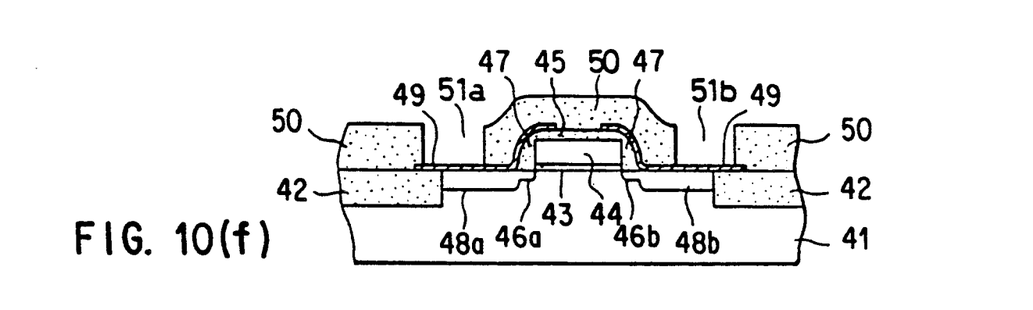

Thereafter, the process is similar to that applied to the preceding embodiment. First, a W film 49 is grown selectively by the low pressure CVD method over the deep $n^+$ diffused layers 48a and 48b in the source and drain regions and over the neighboring insulation films 42, 47, and 45 to creep-up on these films. Then, an insulation film 50 consisting of silicon oxide film is deposited over the surface by the plasma CVD method to form contact holes 51a and 51b that are created by the reactive ion etching, FIG. 10(f). Here, the contact holes are arranged to be formed toward the outside, namely toward the field oxide film, from the source and drain regions. In this case, the W film 49 acts again as an etching stopper so that no etching will occur in the $n^+$ diffused layers 48a and 48b and the field oxide film 42.

Figure 10G:
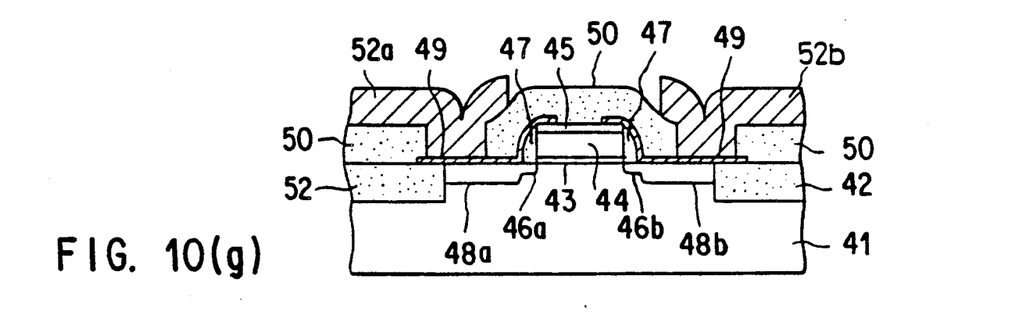

After that, an interconnection layer consisting of Al film is formed by the sputtering method, and the interconnections 52a and 52b and the interconnection for the gate (not shown) are formed by sputtering.

In the present process, the formation process of the insulation film for covering the gate electrode differs from that in the preceding embodiment. Contacts formed in this manner have an extremely high reliability as in the preceding embodiment. Also, in this embodiment, a W film is selectively formed over the source and drain regions and over the insulation film surrounding it. Other high melting point metals such as Mo, Ta, and Ti may be used.

Additional advantages and modifications will readily occur to those skilled in the art. The invention in its broader aspects is therefore not limited to the specific details, representative steps, and illustrative examples shown and described. Accordingly, departures may be made from such details without departing from the spirit or scope of the applicant's general inventive concept.

What is claimed is:

1. A method of forming an electrical connection to a silicon surface of a semiconductor device adjacent a sidewall of insulating material comprising the steps of:
   a. exposing said surface to a halogenated gas of a metal with a high melting point under conditions to reduce said gas with said silicon to result in formation of a layer of said metal having a saturated thickness on said surface, said conditions being selected such that: (i) the saturated thickness of said layer is dependent upon the temperature od deposition, (ii) the saturated thickness of said layer increases with a higher temperature of deposition until an initial maximum thickness is obtainable at a first temperature of deposition and (iii) the saturated thickness of said layer decreases from said initial maximum thickness as the temperature increases from said first temperature of deposition until a second temperature is reached at which a minimized thickness is obtainable, said conditions including deposition of said layer at said second temperature to essentially minimize the saturated thickness of said layer, with said layer also being formed extending up said sidewall; and b. forming a conductor in electrical contact with said layer to thereby form electrical connection with said surface.

2. A method of claim 1 wherein said gas used in said step of exposing is $WF_6$, $MoF_6$, $TaF_6$, or $TiF_6$.

3. A method of claim 2 wherein said conditions include exposing said surface to a rare gas.

4. A method of claim 3 wherein said rare gas is Ar or He.

5. A method of claim 2 wherein said conditions include exposing said surface to $N_2$ gas.

6. A method of claim 1 wherein said high temperature is set ±30 degrees Celsius of said second temperature.

7. A method of claim 1 wherein said second temperature is 550 degrees Celsius.

8. A method of claim 7 wherein said conditions further include a reactor of 0.2 Torr and a partial pressure for said halogenated gas of 0.01 Torr.

9. A method of claim 8 wherein said halogenated gas is $WF_6$.

10. A method of claims 1, 2, 3, 4, 5, 6, 7, 8, or 9 wherein said step of exposing is continued until said metal extends up said sidewall a distance greater than three times the thickness of said layer.

11. A method of claim 10 wherein said step of exposing is continued until said metal extends up said sidewall a distance greater than ten times the thickness of said layer.

12. A method of claims 1, 2, 3, 4, 5, 6, 7, 8, or 9 wherein said insulating layer is $SiO_2$.

13. A method of claim 1 further comprising the steps of:

c. exposing said layer of said metal to a mixture gas of said halogenated gas of a metal and a hydrogen gas to form an additional metal layer on said layer, wherein said step c is performed between said steps a and b, and said layer of said step a is obtained substantially only by the reducing of said halogenated gas with said silicon.

14. A method of claim 13 wherein said step c is performed until a contact hole which comprises said sidewall of said insulating material is buried with said additional metal layer.

* * * * *